(12) United States Patent
Kim et al.

(10) Patent No.: US 12,232,277 B2
(45) Date of Patent: Feb. 18, 2025

(54) DISPLAY DEVICE

(71) Applicant: Samsung Display Co., Ltd., Yongin-si (KR)

(72) Inventors: Jae Ill Kim, Yongin-si (KR); Ji Hyun Kim, Yongin-si (KR); Byoung Haw Park, Yongin-si (KR); Jong Jae Lee, Yongin-si (KR); Jun Pyo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 208 days.

(21) Appl. No.: 18/155,638

(22) Filed: Jan. 17, 2023

(65) Prior Publication Data
US 2023/0284399 A1   Sep. 7, 2023

(30) Foreign Application Priority Data

Mar. 2, 2022  (KR) .................... 10-2022-0026903

(51) Int. Cl.
| | |
|---|---|
| *H05K 5/00* | (2006.01) |
| *G09G 3/00* | (2006.01) |
| *H01L 27/15* | (2006.01) |
| *H01L 33/24* | (2010.01) |
| *H01L 33/44* | (2010.01) |
| *H05K 5/02* | (2006.01) |

(52) U.S. Cl.
CPC ........... *H05K 5/0026* (2013.01); *G09G 3/035* (2020.08); *H01L 27/156* (2013.01); *H01L 33/24* (2013.01); *H01L 33/44* (2013.01); *H05K 5/0217* (2013.01); *H05K 5/0247* (2013.01)

(58) Field of Classification Search
CPC ............................ H05K 5/0026; G06F 1/1652
See application file for complete search history.

(56) References Cited

U.S. PATENT DOCUMENTS

| | | | |
|---|---|---|---|
| 9,615,473 B2 | 4/2017 | Kim | |
| 10,561,024 B2 | 2/2020 | Philibert et al. | |
| 2008/0182435 A1 | 7/2008 | Ho et al. | |
| 2009/0120670 A1 | 5/2009 | Lo et al. | |
| 2011/0080540 A1* | 4/2011 | Tomiyoshi | ........... G02B 6/0083 349/62 |
| 2012/0229733 A1* | 9/2012 | Ishii | .................. G02F 1/133382 349/72 |
| 2013/0148315 A1 | 6/2013 | Dabov | |
| 2015/0208522 A1 | 7/2015 | Kim et al. | |

(Continued)

FOREIGN PATENT DOCUMENTS

| | | |
|---|---|---|
| EP | 2 563 101 A1 | 2/2013 |
| JP | 2013-247189 A | 12/2013 |

(Continued)

*Primary Examiner* — Sherman Ng
(74) *Attorney, Agent, or Firm* — Lewis Roca Rothgerber Christie LLP

(57) ABSTRACT

A display device according to one or more embodiments comprises a flexible display panel, a connection film at least partially overlapping the display panel, and electrically connected to the display panel, source boards at least partially overlapping the connection film, and electrically connected to the connection film, and a flexible printed circuit portion electrically connecting the source boards, and wound or folded on the source boards.

18 Claims, 16 Drawing Sheets

(56) References Cited

U.S. PATENT DOCUMENTS

| | | | |
|---|---|---|---|
| 2016/0163291 A1* | 6/2016 | Amirkhany | G09G 5/18 |
| | | | 345/530 |
| 2016/0205786 A1* | 7/2016 | Nam | H05K 1/0278 |
| | | | 29/830 |
| 2017/0322608 A1* | 11/2017 | Lee | G09G 3/3233 |
| 2018/0153039 A1 | 5/2018 | Lim et al. | |
| 2019/0208642 A1 | 7/2019 | Eun | |
| 2019/0265537 A1* | 8/2019 | Fu | H01R 12/79 |
| 2019/0281692 A1 | 9/2019 | Jeon | |
| 2020/0051474 A1* | 2/2020 | Park | G09G 3/3696 |
| 2020/0107458 A1 | 4/2020 | Park | |
| 2020/0329179 A1 | 10/2020 | Yeh et al. | |

FOREIGN PATENT DOCUMENTS

| | | |
|---|---|---|
| KR | 10-2189784 B1 | 12/2020 |
| WO | WO 2009/038950 A2 | 3/2009 |

* cited by examiner

DISPLAY DEVICE

CROSS-REFERENCE TO RELATED APPLICATION

This application claims priority to, and the benefit of, Korean Patent Application No. 10-2022-0026903, filed on Mar. 2, 2022, in the Korean Intellectual Property Office, the content of which in its entirety is herein incorporated by reference.

BACKGROUND

1. Field

The disclosure relates to a rollable display device.

2. Description of the Related Art

As interest in information display increases and the demand to use portable information media increases, the demand and commercialization for display devices are becoming increasingly focused.

SUMMARY

An aspect of the disclosure provides a display device capable of efficiently utilizing a space inside a cylinder.

A display device according to one or more embodiments includes a flexible display panel, a connection film at least partially overlapping the display panel, and electrically connected to the display panel, source boards at least partially overlapping the connection film, and electrically connected to the connection film, and a flexible printed circuit portion electrically connecting the source boards, and wound or folded on the source boards.

The flexible printed circuit portion may include a first connection portion partially protruding in a first direction, a second connection portion partially protruding in a direction that is substantially opposite to the first connection portion, and a body extending in a second direction that is substantially perpendicular to the first direction.

The source boards may include a connector portion, wherein the first connection portion is electrically connected to a connector portion of one of the source boards, and wherein the second connection portion is electrically connected to a connector portion of another of the source boards.

The body may be on the source boards, and may be wound by being rotated.

The flexible printed circuit portion may further include a folding line extending in the second direction.

The body may be on the source boards, and may be folded in the first direction.

The flexible printed circuit portion may define a groove extending in the second direction.

The body may be on the source boards, and may be folded in the first direction.

The display device may further include a control board spaced apart from a source board of the source boards, and electrically connected to the source board, and a cable between the source board and the control board to electrically connect the source board and the control board.

The display device may further include a housing for accommodating the display panel, and a cylinder inside the housing and winding, and configured to deploy the display panel.

A display device according to one or more embodiments includes a flexible display panel, a connection film at least partially overlapping the display panel, and electrically connected to the display panel, source boards at least partially overlapping the connection film, and electrically connected to the connection film, a flexible printed circuit portion electrically connecting the source boards, and wound or folded on the source boards, and a cylinder for winding and deploying the display panel, wherein the connection film, the source boards, and the flexible printed circuit portion are accommodated in the cylinder.

The flexible printed circuit portion may include a first connection portion partially protruding in a first direction, a second connection portion partially protruding in a direction that is substantially opposite to the first connection portion, and a body extending in a second direction that is substantially perpendicular to the first direction.

The source boards may include a connector portion, wherein the first connection portion is electrically connected to a connector portion of one of the source boards, and wherein the second connection portion is electrically connected to a connector portion of another of the source boards.

The body may be on the source boards, and may be wound by being rotated.

The flexible printed circuit portion may further include a folding line extending in the second direction.

The body may be on the source boards, and may be folded in the first direction.

The flexible printed circuit portion may define a groove extending in the second direction.

The body may be on the source boards, and may be folded in the first direction.

The display device may further include a control board spaced apart from the source board, and electrically connected to the source board, and a cable between the source board and the control board to electrically connect the source board and the control board.

The flexible printed circuit portion may include a flexible printed circuit film.

According to one or more embodiments, the source board and the flexible printed circuit portion may be stably accommodated in the cylinder by electrically connecting the source board, by winding or folding the flexible printed circuit portion. That is, a space inside the cylinder may be efficiently utilized.

An aspect according to one or more embodiments is not limited by the contents above, and more various aspects are included in the present specification.

BRIEF DESCRIPTION OF THE DRAWINGS

The above and other aspects of the disclosure will become more apparent by describing in further detail embodiments thereof with reference to the accompanying drawings, in which.

DETAILED DESCRIPTION

Figure 1:
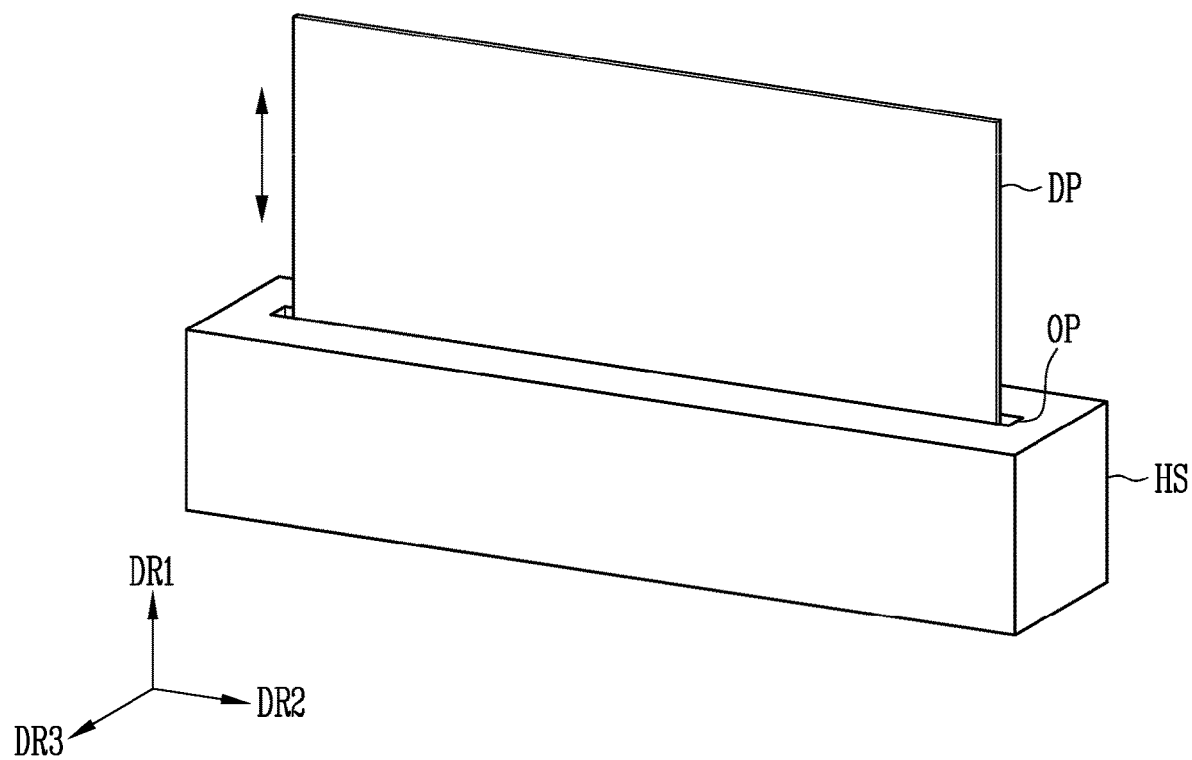
FIGS. 1 and 2 are perspective views illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a display device according to one or more embodiments of the disclosure is described with reference to drawings related to embodiments of the disclosure.

A display device according to one or more embodiments may correspond to a rollable display device.

Figure 2:
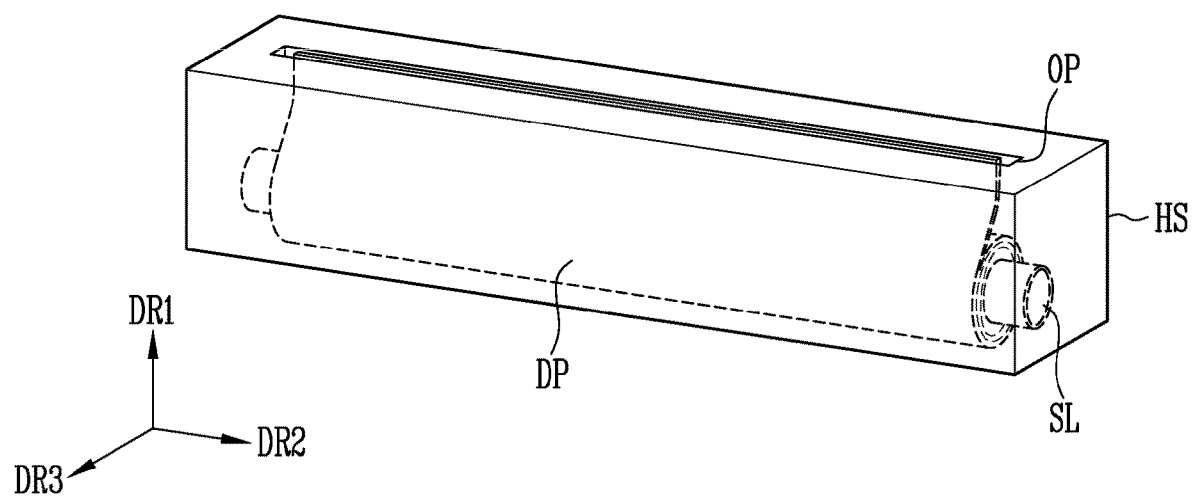

FIGS. 1 and 2 are perspective views illustrating a display device according to one or more embodiments.

FIG. 1 is a state in which the rollable display device is unrolled, and FIG. 2 is a state in which the rollable display device is rolled up.

Referring to FIGS. 1 and 2, the display device according to one or more embodiments may include a display panel DP, a cylinder SL, and a housing HS.

The display panel DP may be a flexible display panel, and for example, may correspond to a rollable display panel.

The cylinder SL may be positioned inside the housing HS. The display panel DP may be wound or deployed along the cylinder SL with a curvature (e.g., predetermined curvature). The cylinder SL may include an opening (e.g., predetermined opening), and a connection film, a source board, a control board, and the like connected to the display panel DP through the opening of the cylinder SL may be accommodated in the cylinder SL.

The housing HS may include, or define, an opening OP on one side surface, and the display panel DP may move to an inside and outside of the housing HS in a first direction DR1 through the opening OP. A shape of the opening OP may correspond to a cross-sectional shape of the display panel DP. For example, when a cross-section of the display panel DP is a quadrangular shape, the shape of the opening OP may be a quadrangular shape, but the disclosure is not limited thereto.

The housing HS may further include a motor capable of winding or deploying the display panel DP by rotating the cylinder SL, and may further include a fixing member for fixing and/or supporting the cylinder SL.

Hereinafter, a display device is described based on the display panel with reference to FIGS. 3 and 4.

Figure 3:
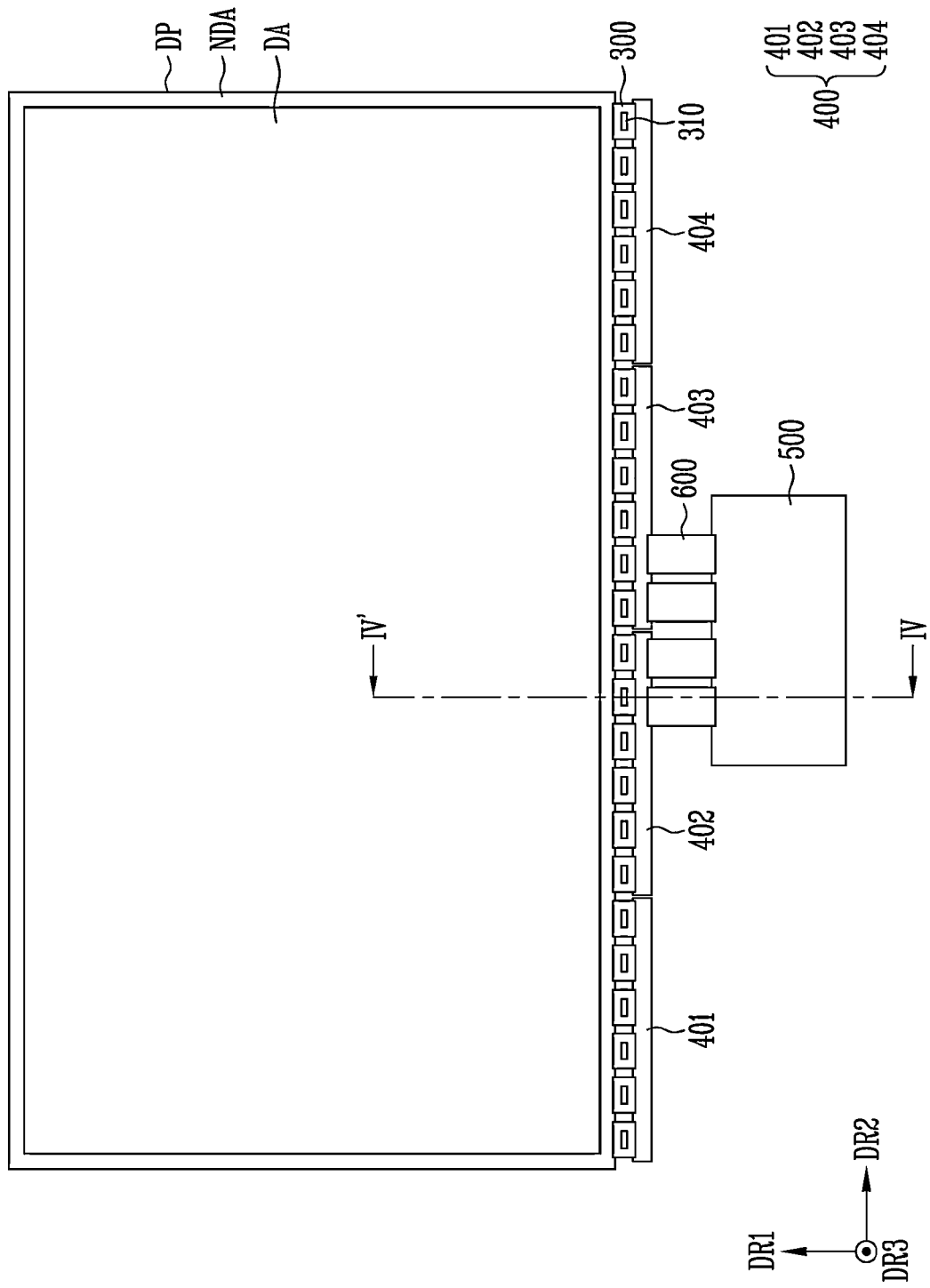
FIG. 3 is a plan view illustrating a display panel in a display device according to one or more embodiments.
Figure 4:
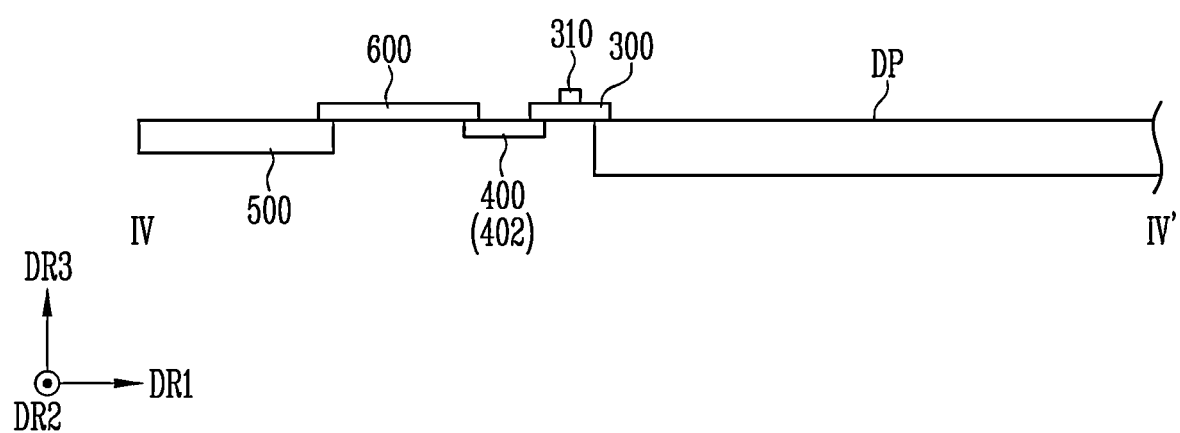
FIG. 4 is a cross-sectional view taken along the line IV-IV' of FIG. 3.

FIG. 3 is a plan view illustrating a display panel in a display device according to one or more embodiments, and FIG. 4 is a cross-sectional view taken along the line IV-IV' of FIG. 3.

Referring to FIGS. 3 and 4, the display device according to one or more embodiments may include a display panel DP, a connection film 300, a data driver 310, a source board 400, a control board 500, and a cable 600.

The display panel DP may have a display area DA in which an image is displayed, and a non-display area NDA located around the display area DA. A plurality of pixels may be provided in the display area DA, and thus the display area DA may display an image. A plurality of pixels may not be provided in the non-display area NDA, and thus the non-display area NDA may not display an image. In the non-display area NDA, a signal line, a voltage line, a pad, and the like for providing a signal, a voltage, and the like to the plurality of pixels may be provided.

The display panel DP may have a rectangular shape extending in the first direction DR1 and a second direction DR2. The disclosure is not limited thereto, and the display panel DP may be implemented in various shapes, such as a square, a circle, and a polygon.

The connection film 300 may at least partially overlap one side of the display panel DP (or the non-display area NDA), and the data driver 310 may be mounted on the connection film 300. The connection film 300 may be positioned on the display panel DP and may at least partially overlap the display panel DP. The data driver 310 may be a driver that provides a data voltage to the pixels on the display panel DP, and may receive a signal (e.g., predetermined signal) and/or voltage through the source board 400 and the control board 500 to be described later.

The connection film 300 may be implemented with a flexible base member. In one or more embodiments, the connection film 300 may be a chip on film (COF), but the disclosure is not limited thereto.

The source board 400 may at least partially overlap one side of the connection film 300. The source board 400 may contact a lower surface of the connection film 300 to at least partially overlap the connection film 300, and may be physically and/or electrically connected to the connection film 300.

The source board 400 may include a first source board 401, a second source board 402, a third source board 403, and a fourth source board 404. The first source board 401, the second source board 402, the third source board 403, and the fourth source board 404 may be spaced apart from each other in the second direction DR2. Although the number of source boards 400 is shown as four in FIG. 3, the number of source boards 400 may be variously changed according to a size of the display panel DP.

In one or more embodiments, the source board 400 may be a flexible printed circuit board (FPCB), but the disclosure is not limited thereto.

Figure 5:
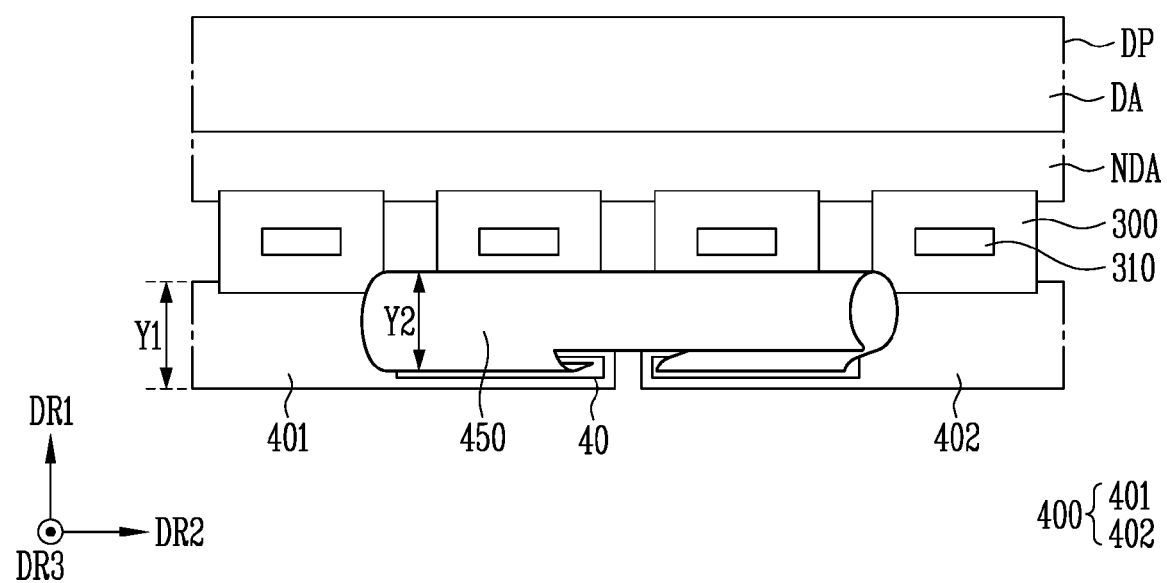
FIG. 5 is a diagram illustrating a flexible printed circuit portion according to one or more embodiments.

In one or more embodiments, two source boards 400 may be electrically connected by a flexible printed circuit portion 450 (refer to FIG. 5). The flexible printed circuit portion 450 may be connected to a connector portion 40 (refer to FIG. 5) of each source board 400 to electrically connect the two source boards 400. For example, the first source board 401 and the second source board 402 may be connected by the flexible printed circuit portion 450 (refer to FIG. 5), and the third source board 403 and the fourth source board 404 may be connected to by the flexible printed circuit portion 450. Contents regarding the flexible printed circuit portion 450 is described in detail below.

The control board 500 is positioned to be spaced apart from the source board 400, and may be electrically connected to the source board 400 by a cable 600 to be described later. The control board 500 may provide image data, a control signal, a power voltage, and the like to the display panel DP. That is, the control board 500 may include a timing controller that controls driving of the display panel DP, a power supply that supplies the power voltage to the display panel DP, and the like.

The cable 600 may be positioned on the source board 400 and may at least partially overlap the source board 400, and the cable 600 may be positioned on the control board 500 and may at least partially overlap the control board 500. The cable 600 may be positioned between the source board 400 and the control board 500, and may physically and/or electrically connect the source board 400 and the control board 500. In one or more embodiments, the cable 600 may be electrically connected to the source board 400 and the control board 500. For example, the cable 600 may connect the second source board 402 and the control board 500, and may connect the third source board 403 and the control board 500. Accordingly, the control signal, the power voltage, and the like provided from the control board 500 may be supplied to the display panel DP through the cable 600, the source board 400, and the connection film 300.

Hereinafter, the flexible printed circuit portion for electrically connecting the source board is described with reference to FIGS. 5 to 8.

Figure 6:
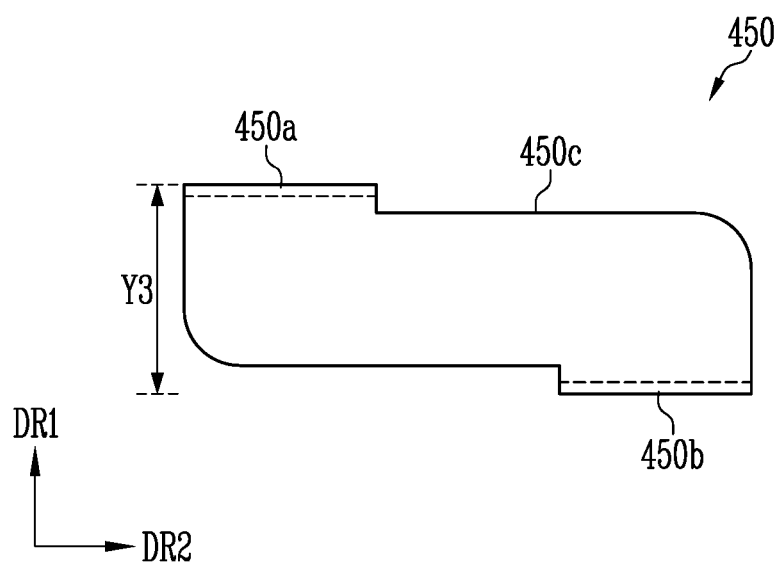
FIG. 6 is a diagram illustrating a flexible printed circuit portion according to one or more embodiments.
Figure 7:
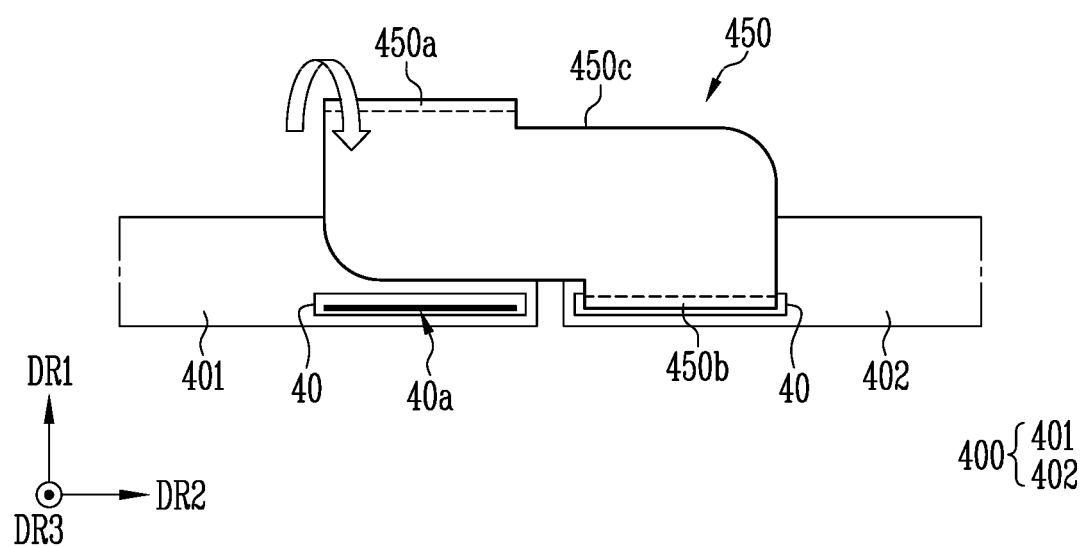
FIG. 7 is a diagram illustrating a state in which the flexible printed circuit portion of FIG. 6 is connected to a source board.
Figure 8:
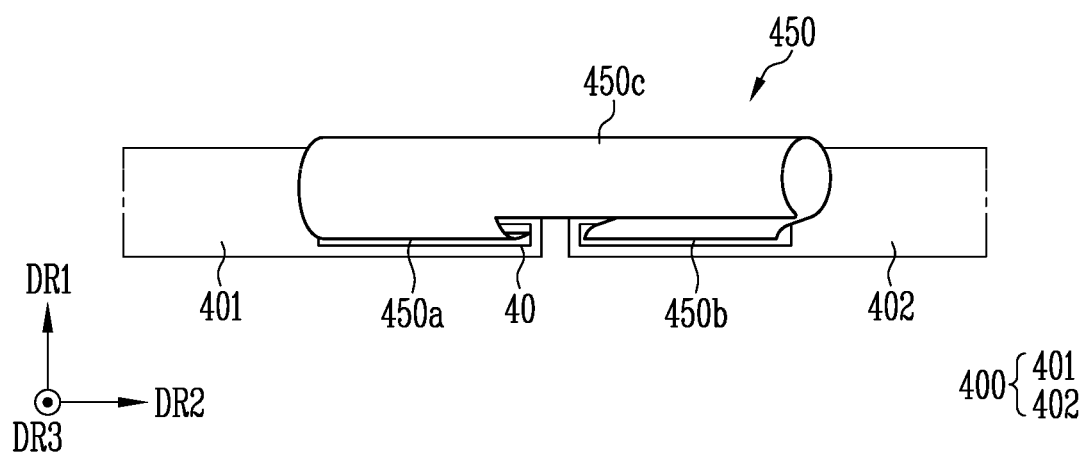
FIG. 8 is a diagram illustrating a state in which the flexible printed circuit portion of FIG. 6 is connected to the source board.
Figure 9:
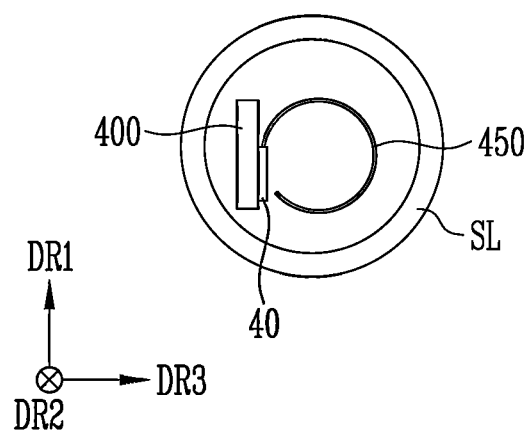
FIG. 9 is a diagram schematically illustrating a state in which a portion of a display device shown in FIG. 8 is located inside a cylinder.

FIG. 5 is a diagram illustrating a flexible printed circuit portion according to one or more embodiments, FIG. 6 is a diagram illustrating a flexible printed circuit portion according to one or more embodiments, FIG. 7 is a diagram illustrating a state in which the flexible printed circuit portion of FIG. 6 is connected to the source board, FIG. 8 is a diagram illustrating a state in which the flexible printed circuit portion of FIG. 6 is connected to the source board, and FIG. 9 is a diagram schematically illustrating a state in which a portion of a display device shown in FIG. 8 is located inside a cylinder.

Referring to FIG. 5, a display device according to one or more embodiments may include the display panel DP, the connection film 300, the data driver 310, the source board 400, and the flexible printed circuit portion 450. The display panel DP, the connection film 300, the data driver 310, and the source board 400 are the same as those described with reference to FIGS. 3 and 4, and thus a repetitive description is omitted below.

The source board 400 may be accommodated in the cylinder SL (refer to FIGS. 1 and 2) when the display panel DP is wound inside the housing HS (refer to FIGS. 1 and 2). For example, the cylinder SL may have a cylindrical shape having a diameter of about 40 mm. As the display device according to one or more embodiments is implemented with high resolution, the size and/or area of a circuit design provided on the source board 400 may increase. To electrically connect the source boards 400, the size and/or area of the flexible printed circuit portion 450 may be suitably increased. However, because an inner space of the cylinder SL of a rollable display device is limited, a display device suitable for high resolution may be implemented by variously changing a shape and location of the flexible printed circuit portion 450.

In one or more embodiments, the flexible printed circuit portion 450 may be a flexible printed circuit film (FPC). Accordingly, the source board 400 and the flexible printed circuit portion 450 may be stably accommodated in the cylinder SL of the rollable display device, by winding or folding a portion of the flexible printed circuit portion 450. In addition, in one or more embodiments, the rollable display device may efficiently utilize a space inside the cylinder SL.

The flexible printed circuit portion 450 may physically and/or electrically connect the source boards 400 to each other. The flexible printed circuit portion 450 may transmit a signal, a voltage, and the like from one source board (for example, the second source board 402) to another source board (for example, the first source board 401).

The flexible printed circuit portion 450 may be connected to the source boards 400. That is, the source board 400 may include the connector portion 40, one end of the flexible printed circuit portion 450 may be bent and connected to an opening 40a (refer to FIG. 7) of the connector portion 40, and thus the source board 400 and the flexible printed circuit portion 450 may be physically and/or electrically connected. For example, one end of the flexible printed circuit portion 450 may be connected to the connector portion 40 of the first source board 401, another end of the flexible printed circuit portion 450 may be connected to the connector portion 40 of the second source board 402, and thus the first source board 401 and the second source board 402 may be electrically connected to each other. That is, as a portion of the flexible printed circuit portion 450 is wound or bent, the source boards 400 may be electrically connected. When the flexible printed circuit portion 450 is connected to the source boards 400, a vertical length Y2 of the flexible printed circuit portion 450 may correspond to about 20 mm or less. Accordingly, in one or more embodiments, because the flexible printed circuit portion 450 for connecting the source boards 400 corresponds to within a vertical length Y1 of the source board 400, the space inside the cylinder SL (refer to FIGS. 1 and 2) may be efficiently utilized in the rollable display device.

Referring to FIG. 6, the flexible printed circuit portion 450 according to one or more embodiments may include a portion protruding to both sides with respect to the first direction DR1, and another portion extending in the second direction DR2 perpendicular to the first direction DR1. For example, the flexible printed circuit portion 450 may include a first connection portion 450a partially protruding in the first direction DR1, a second connection portion 450b partially protruding in a direction that is opposite to the first connection portion 450a, and a body 450c extending in the direction DR2.

The flexible printed circuit portion 450 may extend in the first direction DR1, and a portion extending in the second direction DR2 may extend longer (e.g., to a greater degree) than a portion extending in the first direction DR1. Here, the portion partially protruding in the first direction DR1 may be referred to as the first connection portion 450a (or one end) and the second connection portion 450b (or another end), and the portion extending in the second direction DR2 may be referred to as the body 450c. The first connection portion 450a and the second connection portion 450b may extend (or protrude) in different directions with respect to both sides of the body 450c so that the first connection portion 450a and the second connection portion 450b are not positioned on the same line with respect to the first direction DR1.

The first connection portion 450a and the second connection portion 450b may be bent and connected to the connector portion 40 of the source board 400. For example, the first connection portion 450a and the second connection portion 450b may be connected to respective connector portions of different source boards 400 to electrically connect two source boards 400. A dotted line shown in the first connection portion 450a and the second connection portion 450b may correspond to a boundary line on which a connector terminal, which is attachable to the flexible printed circuit portion 450, is located.

The body 450c may correspond to a rectangular shape in which at least one corner is rounded. For example, the body 450c may have a rounded corner at a portion where the first connection portion 450a and the second connection portion 450b protrude. Because the flexible printed circuit portion 450 has the corner having a rounded rectangular shape, the space inside the cylinder SL may be widely secured when the flexible printed circuit portion 450 is accommodated in the cylinder SL (refer to FIGS. 1 and 2) of the rollable display device.

For example, a vertical length Y3 of the flexible printed circuit portion 450 may correspond to a maximum of about 63 mm. Accordingly, the source board 400 and the flexible printed circuit portion 450 may be stably accommodated inside the cylinder SL (refer to FIGS. 1 and 2) of the rollable display device, by winding or folding a portion of the flexible printed circuit portion 450 and electrically connecting the source board 400.

Referring to FIGS. 7 and 8, the first connection portion 450a may be connected to the connector portion 40 of the first source board 401, and the second connection portion 450b may be connected to the connector portion 40 of the second source board 402. For example, the second connection portion 450b of the flexible printed circuit portion 450 may be connected to the connector portion 40 of the second source board 402, and as the body 450c of the flexible printed circuit portion 450 rotates in a third direction DR3 (or rotates along an arrow shown in FIG. 7), the first connection portion 450a of the flexible printed circuit portion 450 may be connected to the connector portion 40 of the first source board 401. That is, the flexible printed circuit portion 450 may be connected to the source board 400 in a wound form (or rolling form) on the source board 400.

Referring to FIG. 9, it may be seen that the flexible printed circuit portion 450 connected to the source board 400 is located inside the cylinder SL. Because the flexible printed circuit portion 450 may be connected to the source board 400 in the wound form (or the rolling form) on the source board 400, the flexible printed circuit portion 450 may be stably accommodated in the cylinder SL. Accordingly, the space inside the cylinder SL may be efficiently utilized in the rollable display device.

Hereinafter, another shape of the flexible printed circuit portion according to one or more embodiments is described with reference to FIGS. 10 to 12.

Figure 10:
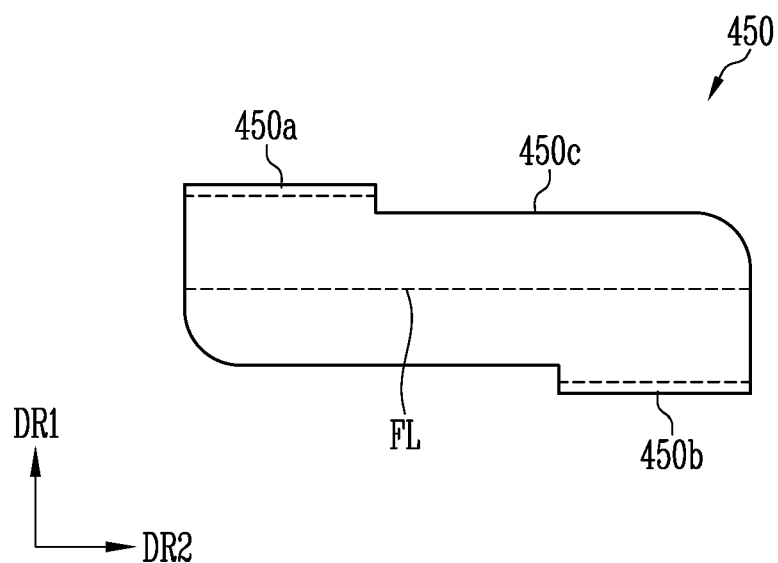
FIGS. 10 and 11 are diagrams illustrating a flexible printed circuit portion according to one or more embodiments.
Figure 11:
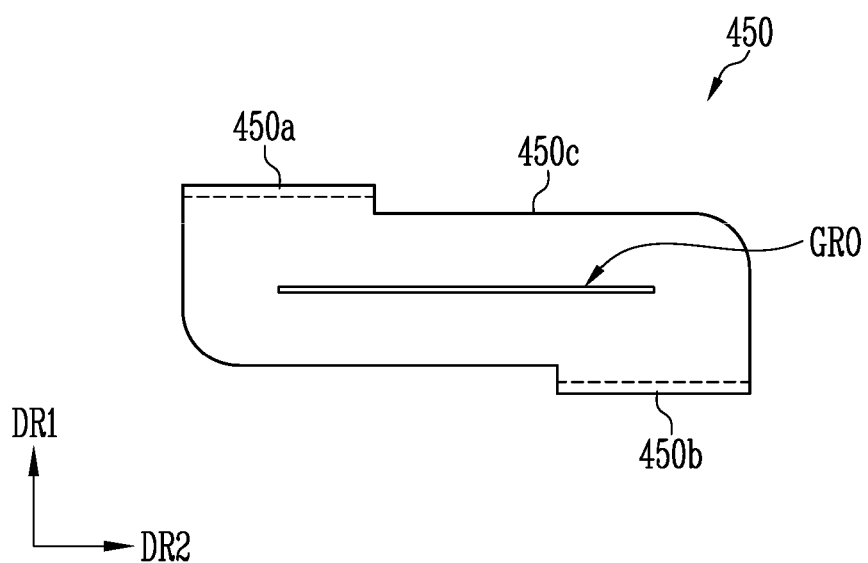

FIGS. 10 and 11 are diagrams illustrating a flexible printed circuit portion according to one or more embodiments. FIG. 12 is a diagram illustrating a state in which the flexible printed circuit portion of FIG. 10 or 11 is connected to the source board.

The flexible printed circuit portion shown in FIGS. 10 and 11 is similar to the flexible printed circuit portion shown in FIG. 6, and thus a repeated description is omitted below.

Referring to FIG. 10, the flexible printed circuit portion 450 according to one or more embodiments may include the first connection portion 450a partially protruding in the first direction DR1, the second connection portion 450b partially protruding in the direction that is opposite to the first connection portion 450a, and the body 450c extending in the second direction DR2, and may further include a folding line FL extending in the second direction DR2.

The flexible printed circuit portion 450 may be folded in the first direction DR1 based on the folding line FL along the second direction DR2. As the flexible printed circuit portion 450 is folded along the folding line FL, the first connection portion 450*a* may be located on the same line as the second connection portion 450*b*. The first connection portion 450*a* may be electrically connected to the first source board 401 (refer to FIG. 3), and the second connection portion 450*b* may be electrically connected to the second source board 402 (refer to FIG. 3). Accordingly, the flexible printed circuit portion 450 may electrically connect the source boards 400.

In one or more embodiments, when the source boards 400 are connected to the flexible printed circuit portion 450, because the flexible printed circuit portion 450 includes the folding line FL, a process of folding the flexible printed circuit portion 450 in advance may be omitted. Accordingly, a manufacturing process step of the display device may be reduced.

Referring to FIG. 11, the flexible printed circuit portion 450 according to one or more embodiments may include the first connection portion 450*a* partially protruding in the first direction DR1, the second connection portion 450*b* partially protruding in the direction that is opposite to the first connection portion 450*a*, and the body 450*c* extending in the second direction DR2, and may further include, or define, a groove GRO extending in the second direction DR2. At this time, the flexible printed circuit portion 450 may design the flexible printed circuit portion 450 in consideration of a position of the groove GRO.

The flexible printed circuit portion 450 may be folded in the first direction DR1 based on the second direction DR2 along the groove GRO. As the flexible printed circuit portion 450 is folded along the groove GRO, the first connection portion 450*a* may be located on the same line as the second connection portion 450*b*. The first connection portion 450*a* may be electrically connected to the first source board 401 (refer to FIG. 3), and the second connection portion 450*b* may be electrically connected to the second source board 402 (refer to FIG. 3). Accordingly, the flexible printed circuit portion 450 may electrically connect the source boards 400.

Figure 12:
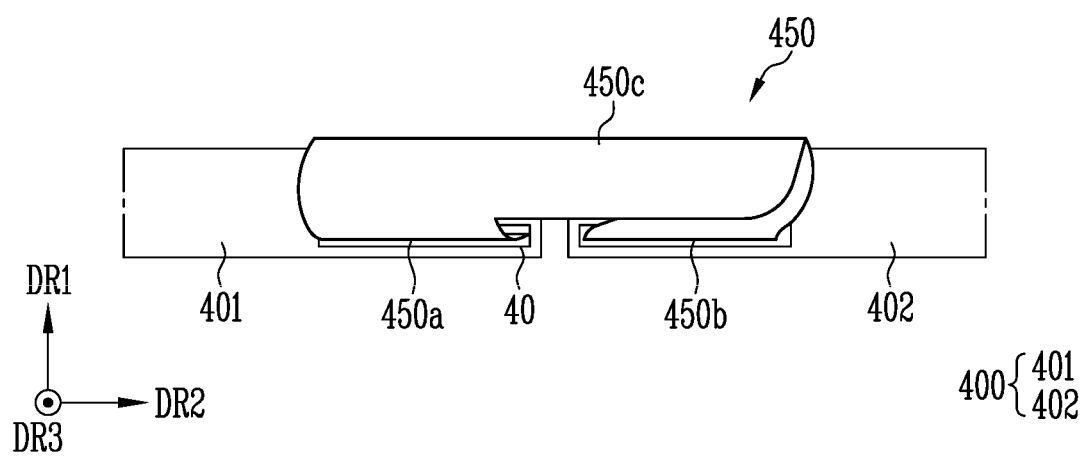
FIG. 12 is a diagram illustrating a state in which the flexible printed circuit portion of FIG. 10 or 11 is connected to the source board.

Referring to FIG. 12, the first connection portion 450*a* may be connected to the connector portion 40 of the first source board 401, and the second connection portion 450*b* may be connected to the connector portion 40 of the second source board 402. For example, as the second connection portion 450*b* of the flexible printed circuit portion 450 is connected to the connector portion 40 of the second source board 402, and the body 450*c* of the flexible printed circuit portion 450 is folded, the first connection portion 450*a* of the flexible printed circuit portion 450 may be connected to the connector portion 40 of the first source board 401. That is, the flexible printed circuit portion 450 may be connected to the source board 400 in a form folded in the first direction DR1 on the source board 400.

Because the flexible printed circuit portion 450 may be connected to the source board 400 in the folded form on the source board 400, the flexible printed circuit portion 450 may be stably accommodated in the cylinder SL (refer to FIGS. 1 and 2). Accordingly, the space inside the cylinder SL may be efficiently utilized in the rollable display device.

Hereinafter, the configuration of the display panel described with reference to FIGS. 1 to 4 is described with reference to FIG. 13.

Figure 13:
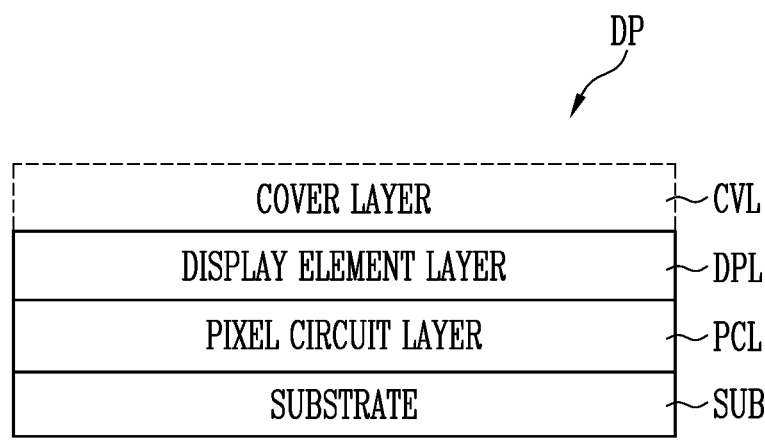
FIG. 13 is a schematic cross-sectional view of a display panel according to one or more embodiments.

FIG. 13 is a schematic cross-sectional view of a display panel according to one or more embodiments.

Referring to FIG. 13, the display panel DP may include a substrate SUB, and a pixel circuit layer PCL, a display element layer DPL, and a cover layer CVL sequentially located on the substrate SUB.

The substrate SUB may be formed of an insulating material, such as glass or resin. In addition, the substrate SUB may be formed of a material having flexibility to be bent or folded, and may have a single layer structure or a multilayer structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring the substrate SUB is not limited to the above-described embodiments.

The pixel circuit layer PCL may be provided on the substrate SUB and may include a plurality of transistors and signal lines connected to the transistor. For example, each transistor may have a form in which a semiconductor layer, a gate electrode, a first terminal, and a second terminal are sequentially stacked with an insulating layer interposed therebetween. The semiconductor layer may include amorphous silicon, poly silicon, low temperature poly silicon, an organic semiconductor, and an oxide semiconductor. The gate electrode, the first terminal, and the second terminal may include one of aluminum, copper, titanium, and molybdenum, but the disclosure is not limited thereto. In addition, the pixel circuit layer PCL may include one or more insulating layers.

The display element layer DPL may be located on the pixel circuit layer PCL. The display element layer DPL may include a light emitting element emitting light. The light emitting element may be an organic light emitting diode, an inorganic light emitting element including an inorganic light emitting material, or a light emitting element that emits light by changing a wavelength of emitted light using a quantum dot.

The cover layer CVL may be selectively located on the display element layer DPL. The cover layer CVL may be in a form of an encapsulation substrate or an encapsulation layer formed of multiple layers. When the cover layer CVL is in the form of the encapsulation layer, the cover layer CVL may include an inorganic layer and/or an organic layer. For example, the cover layer CVL may have a form in which an inorganic layer, an organic layer, and an inorganic layer are sequentially stacked. The cover layer CVL may reduce or prevent external air and moisture from penetrating into the display element layer DPL and the pixel circuit layer PCL.

According to one or more embodiments, the cover layer CVL may be formed of a heat and/or photo-curable resin, may be coated on the substrate SUB in a liquid form, and then may be cured by a curing process using heat and/or light. At this time, the cover layer CVL may protect the light emitting element and more stably fix the light emitting element.

A window for protecting an exposed surface of the display panel DP may be provided on the display panel DP. The window may protect the display panel DP from external impact and may provide an input surface and/or a display surface to a user.

Hereinafter, a pixel and a light emitting element of a display device according to one or more embodiments are described with reference to FIGS. 14 to 16.

Figure 14:
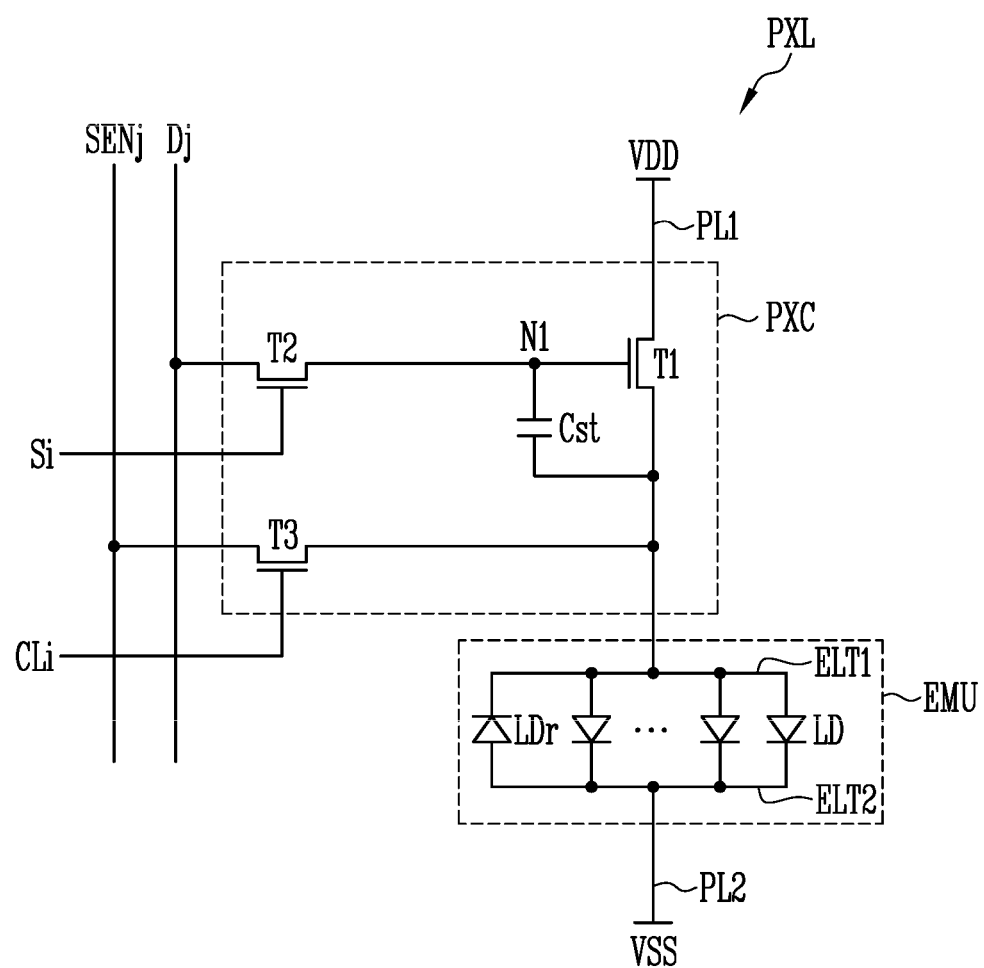
FIG. 14 is a circuit diagram of one pixel of a display device according to one or more embodiments.
Figure 15:
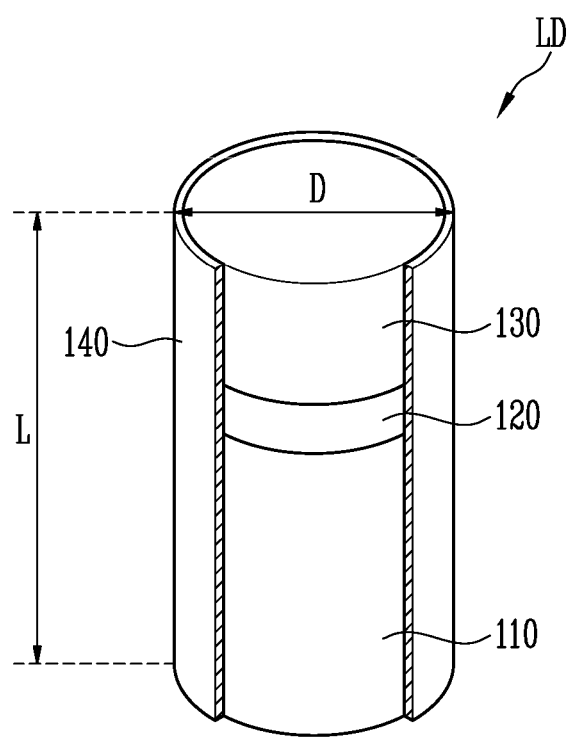
FIG. 15 is a perspective view illustrating a light emitting element according to one or more embodiments.
Figure 16:
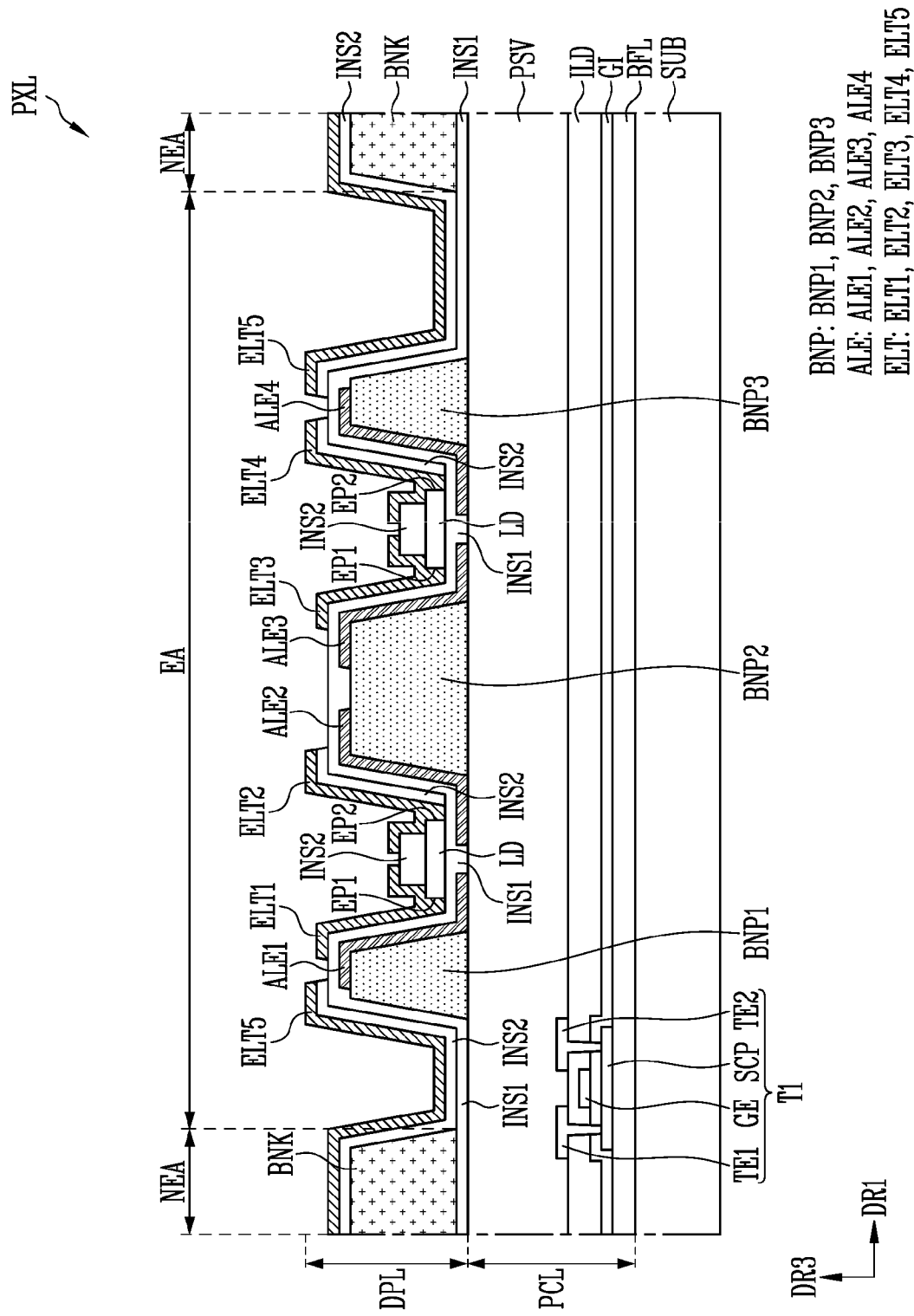
FIG. 16 is a diagram illustrating one or more embodiments of a pixel included in a display device according to one or more embodiments.

FIG. 14 is a circuit diagram of one pixel of a display device according to one or more embodiments, FIG. 15 is a perspective view illustrating a light emitting element according to one or more embodiments, and FIG. 16 is a diagram illustrating one or more embodiments of a pixel included in a display device according to one or more embodiments.

Referring to FIG. 14, one pixel PXL may include at least one light emitting unit EMU that generates light of a luminance corresponding to a data signal. In addition, one pixel PXL may selectively further include a pixel circuit PXC for driving the light emitting unit EMU.

The light emitting unit EMU may include light emitting elements LD connected in parallel between a first power line PL1 to which a voltage of first driving power VDD is applied, and a second power line PL2 to which a voltage of second driving power VSS is applied.

For example, the light emitting unit EMU may include a first pixel electrode ELT1 connected to the first driving power VDD via the pixel circuit PXC and the first power line PL1, a second pixel electrode ELT2 connected to the second driving power VSS through the second power line PL2, and the light emitting elements LD connected in parallel and in the same direction between the first pixel electrode ELT1 and the second pixel electrode ELT2. In one or more embodiments, the first pixel electrode ELT1 may be an anode, and the second pixel electrode ELT2 may be a cathode.

Each of the light emitting elements LD included in the light emitting unit EMU may include one end (or a first end) connected to the first driving power VDD through the first pixel electrode ELT1, and another end (or second end) connected to the second driving power VSS through the second pixel electrode ELT2.

The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set to be greater than or equal to a threshold voltage of the light emitting elements LD during an emission period of the pixel PXL.

As described above, each light emitting element LD connected in parallel in the same direction (for example, a forward direction) between the first pixel electrode ELT1 and the second pixel electrode ELT2 to which voltages of different potentials are respectively supplied may configure each effective light source. The effective light sources may be gathered to configure the light emitting unit EMU of the pixel PXL.

According to one or more embodiments, the light emitting unit EMU may further include at least one ineffective light source, for example, a reverse light emitting element LDr, in addition to the light emitting elements LD configuring each effective light source. The reverse light emitting element LDr is connected in parallel between the first pixel electrode ELT1 and the second pixel electrode ELT2 together with the light emitting elements LD configuring the effective light sources, and is connected between the first pixel electrode ELT1 and the second pixel electrode ELT2 in a direction opposite to the light emitting elements LD. The reverse light emitting element LDr maintains an inactive state even though a driving voltage (e.g., predetermined driving voltage, for example, a forward driving voltage) is applied between the first pixel electrode ELT1 and the second pixel electrode ELT2, and thus a current substantially does not flow through the reverse light emitting element LDr.

The light emitting elements LD of the light emitting unit EMU may emit light with a luminance corresponding to the driving current supplied through the pixel circuit PXC. For example, during each frame period, the pixel circuit PXC may supply the driving current corresponding to a grayscale value of one frame data to the light emitting unit EMU. The driving current supplied to the light emitting unit EMU may be divided, and may flow through each of the light emitting elements LD. Accordingly, the light emitting unit EMU may emit light of the luminance corresponding to the driving current while each light emitting element LD emits light with the luminance corresponding to the current flowing therethrough.

FIG. 14 shows one or more embodiments in which all of the light emitting elements LD configuring the light emitting unit EMU are connected in parallel, but the disclosure is not limited thereto.

The pixel circuit PXC is connected to a scan line Si and a data line Dj of one pixel PXL. For example, when the pixel PXL is located in an i-th (i is a natural number) row and a j-th (j is a natural number) column of the display area DA, the pixel circuit PXC of the pixel PXL may be connected to an i-th scan line Si and a j-th data line Dj of the display area DA. In addition, the pixel circuit PXC may be connected to an i-th control line CLi and a j-th sensing line SENj of the display area DA.

The pixel circuit PXC may include a first transistor T1, a second transistor T2, a third transistor T3, and a storage capacitor Cst.

A first terminal of the first transistor T1 (or a driving transistor) is connected to the first driving power VDD, and a second terminal is electrically connected to the first pixel electrode ELT1. A gate electrode of the first transistor T1 is connected to a first node N1. Accordingly, the first transistor T1 may control an amount of the driving current supplied to the light emitting elements LD in response to a voltage of the first node N1.

A first terminal of the second transistor T2 (or a switching transistor) is connected to the data line Dj, and a second terminal is connected to the first node N1. A gate electrode of the second transistor T2 is connected to the scan line Si. The second transistor T2 is turned on when a scan signal (e.g., high level) of a turn-on voltage is supplied from the scan line Si to electrically connect the data line Dj and the first node N1. At this time, when a data signal of one frame is supplied to the data line Dj, the data signal is transmitted to the first node N1. The data signal transmitted to the first node N1 is charged in the storage capacitor Cst.

The third transistor T3 is connected between the first transistor T1 and the sensing line SENj. For example, a first terminal of the third transistor T3 is connected to the first terminal of the first transistor T1, and a second terminal of the third transistor T3 is connected to the sensing line SENj. A gate electrode of the third transistor T3 is connected to the control line CLi. The third transistor T3 is turned on by a control signal (e.g., high level) of a gate-on voltage supplied to the control line CLi during a sensing period (e.g., predetermined sensing period) to electrically connect the sensing line SENj and the first transistor T1. The sensing period may be a period for extracting characteristic information (for example, a threshold voltage or the like of the first transistor T1) of each of the pixels PXL located in the display area DA.

One electrode of the storage capacitor Cst is connected to the first node N1, and another electrode is connected to the second terminal of the first transistor T1. The storage capacitor Cst may be charged with a voltage corresponding to a difference between a voltage corresponding to the data signal supplied to the first node N1 and a voltage of the second terminal of the first transistor T1, and may maintain the charged voltage until a data signal of a next frame is supplied.

FIG. 14 discloses one or more embodiments in which all of the first to third transistors T1 to T3 are N-type transistors, but the disclosure is not limited thereto. According to one or more embodiments, at least one of the first to third transistors T1 to T3 may be changed to a P-type transistor.

In addition, FIG. 14 discloses one or more embodiments in which the light emitting unit EMU is connected between the pixel circuit PXC and the second driving power VSS, but the light emitting unit EMU may be connected between the first driving power VDD and the pixel circuit PXC in one or more other embodiments.

Referring to FIG. 15, the light emitting element LD included in the display device according to one or more embodiments may include a first semiconductor layer 110, a second semiconductor layer 130, and an active layer 120 positioned between the first semiconductor layer 110 and the second semiconductor layer 130. For example, the light emitting element LD may be configured as a stack in which the first semiconductor layer 110, the active layer 120, and the second semiconductor layer 130 are sequentially stacked along a length L direction.

The light emitting element LD may be provided in a rod shape extending in one direction, that is, a cylinder shape. When an extension direction of the light emitting element LD is referred to as the length L direction, the light emitting element LD may have one end and another end along the length L direction. Although FIG. 15 shows the light emitting element of a columnar shape, the type and/or shape of the light emitting element according to one or more embodiments is not limited thereto.

The light emitting element LD may be a bar shape light emitting diode manufactured in a bar shape. In the present specification, the term "bar shape" includes a rod-like shape or a bar-like shape that is long (that is, having an aspect ratio greater than 1) in the length L direction, such as a circular column or a polygonal column, and a shape of a cross-section thereof is not particularly limited.

The light emitting element LD may have a size as small as a nano scale to a micro scale. Each of the light emitting elements LD may have a diameter D and/or a length L of a range of a nano scale to a micro scale. The size of the light emitting element LD may be variously changed according to a design condition of various devices using a light emitting device using the light emitting element LD as a light source, for example, a display device.

The first semiconductor layer 110 may include at least one n-type semiconductor layer. For example, the first semiconductor layer 110 may include any one semiconductor material among InAlGaN, GaN, AlGaN, InGaN, AlN, and InN, and may include an n-type semiconductor layer doped with a first conductive dopant, such as Si, Ge, or Sn. However, a material configuring the first semiconductor layer 110 is not limited thereto, and various other materials may configure the first semiconductor layer 110.

The active layer 120 may be located on the first semiconductor layer 110 and may be formed in a single or multiple quantum well structure. In one or more embodiments, a clad layer doped with a conductive dopant may be formed on and/or under the active layer 120. For example, the clad layer may be formed as an AlGaN layer or an InAlGaN layer. According to one or more embodiments, a material of AlGaN, InAlGaN, or the like may be used to form the active layer 120, and various other materials may configure the active layer 120.

When a voltage equal to or greater than a threshold voltage is applied to both ends of the light emitting element LD, the light emitting element LD emits light while electron-hole pairs are combined in the active layer 120. By controlling light emission of the light emitting element LD using such a principle, the light emitting element LD may be used as a light source of various light emitting devices including the pixel of the display device.

The second semiconductor layer 130 may be located on the active layer 120 and may include a semiconductor layer of a type different from that of the first semiconductor layer 110. For example, the second semiconductor layer 130 may include at least one p-type semiconductor layer. For example, the second semiconductor layer 130 may include at least one semiconductor material among InAlGaN, GaN, AlGaN, InGaN, AlN, and InN, and may include a p-type semiconductor layer doped with a second conductive dopant, such as Mg, Zn, Ca, Sr, or Ba. However, a material configuring the second semiconductor layer 130 is not limited thereto, and various other materials may configure the second semiconductor layer 130.

In the above-described embodiments, each of the first semiconductor layer 110 and the second semiconductor layer 130 is configured of one layer, but the disclosure is not limited thereto. In one or more embodiments, according to the material of the active layer 120, each of the first semiconductor layer 110 and the second semiconductor layer 130 may further include one or more layers, for example, a clad layer and/or a tensile strain barrier reducing (TSBR) layer. The TSBR layer may be a strain alleviating layer located between semiconductor layers of which lattice structures are different to serve as a buffer for reducing a lattice constant difference. The TSBR layer may be configured of a p-type semiconductor layer, such as p-GaInP, p-AlInP, or p-AlGaInP, but the disclosure is not limited thereto.

In addition, according to one or more embodiments, the light emitting element LD may further include an insulating layer 140 provided on a surface. The insulating layer 140 may be formed on the surface of the light emitting element LD to surround an outer circumferential surface of the active layer 120, and may further surround one area of the first semiconductor layer 110 and the second semiconductor layer 130. However, according to one or more embodiments, the insulating layer 140 may expose the both ends of the light emitting element LD having different polarities. For example, the insulating layer 140 may not cover and may expose one end of each of the first semiconductor layer 110 and the second semiconductor layer 130 positioned at the both ends of the light emitting element LD in the length L direction, for example, two bottom surfaces of a cylinder (an upper surface and a lower surface of the light emitting element LD).

When the insulating layer 140 is provided on the surface of the light emitting element LD, for example, a surface of the active layer 120, a likelihood of the active layer 120 being short-circuited with at least one electrode (for example, at least one contact electrode among contact electrodes connected to the both ends of the light emitting element LD) or the like, may be reduced or prevented. Accordingly, electrical stability of the light emitting element LD may be secured.

In one or more embodiments, the light emitting element LD may further include an additional component in addition to the first semiconductor layer 110, the active layer 120, the second semiconductor layer 130, and the insulating layer 140. For example, the light emitting element LD may additionally include one or more phosphor layers, active layers, semiconductor layers and/or electrodes located on one end side of the first semiconductor layer 110, the active layer 120, and the second semiconductor layer 130.

Referring to FIG. 16, a pixel PXL according to one or more embodiments may include a substrate SUB, a pixel circuit layer PCL positioned on one surface of the substrate SUB, and a display element layer DPL.

The substrate SUB may be a rigid substrate or a flexible substrate, and may be a substrate capable of transmitting light by including a transparent insulating material. The substrate SUB may include an emission area EA in which a light emitting element LD is located to emit light, and a non-emission area NEA in which light is not emitted.

The pixel circuit layer PCL may include a buffer layer BFL, a first transistor T1, a plurality of insulating layers GI and ILD, and a protective layer PSV.

The buffer layer BFL may reduce or prevent impurities being diffused into the pixel circuit layer PCL. The buffer layer BFL may be an inorganic insulating layer including an inorganic material. For example, the buffer layer BFL may include at least one of a metal oxide, such as silicon nitride ($SiN_x$), silicon oxide ($SiO_x$), silicon oxynitride ($SiO_xN_y$), and aluminum oxide ($AlO_x$). The buffer layer BFL may be omitted according to a material, a process condition, and the like of the substrate SUB.

The first transistor T1 may include a semiconductor pattern SCP, a gate electrode GE, a drain electrode TE1, and a source electrode TE2. According to one or more embodiments, the drain electrode TE1 and the source electrode TE2 may be interchanged.

The semiconductor pattern SCP is positioned on the buffer layer BFL. The semiconductor pattern SCP may include a drain area connected to the drain electrode TE1, a source area connected to the source electrode TE2, and a channel area between the drain area and the source area. The channel area may overlap the gate electrode GE of the first transistor T1. The semiconductor pattern SCP may be formed of polysilicon, amorphous silicon, an oxide semiconductor, or the like.

The gate insulating layer GI is positioned on the semiconductor pattern SCP to cover the semiconductor pattern SCP and the buffer layer BFL. The gate insulating layer GI may be an inorganic insulating layer including an inorganic material. For example, the gate insulating layer GI may include at least one of a metal oxide, such as silicon nitride ($SiN_x$), silicon oxide ($SiO_x$), silicon oxynitride ($SiO_xN_y$), and aluminum oxide ($AlO_x$). According to one or more embodiments, the gate insulating layer GI may be formed of an organic insulating layer including an organic material. The gate insulating layer GI may be provided as a single layer, or may be provided as multiple layers of double or more layers.

The gate electrode GE is positioned on the gate insulating layer GI to overlap the channel area of the semiconductor pattern SCP. The gate electrode GE may be configured as a single layer with a material selected from a group consisting of copper (Cu), molybdenum (Mo), tungsten (W), aluminum neodymium (AlNd), titanium (Ti), aluminum (Al), silver (Ag), and an alloy thereof alone or a mixture thereof. In addition, the gate electrode GE may be configured as a double layer or multiple layer structure of molybdenum (Mo), titanium (Ti), copper (Cu), aluminum (Al), or silver (Ag), which is a low-resistance material.

The interlayer insulating layer ILD is positioned on the gate electrode GE to cover the gate electrode GE and the gate insulating layer GI. The interlayer insulating layer ILD may include the same material as the gate insulating layer GI, or may include one or more materials selected from materials exemplified as a configuration material of the gate insulating layer GI.

The interlayer insulating layer ILD may include, or define, one or more contact holes for connecting the drain electrode TE1 of the first transistor T1 and the source electrode TE2 of the first transistor T1 to the drain area and the source area of the semiconductor pattern SCP, respectively.

The drain electrode TE1 of the first transistor T1 and the source electrode TE2 of the first transistor T1 are located on the interlayer insulating layer ILD.

The drain electrode TE1 and the source electrode TE2 may be respectively connected to the source area and the drain area of the semiconductor pattern SCP through contact holes sequentially passing through the gate insulating layer GI and the interlayer insulating layer ILD. The drain electrode TE1 may have the same configuration as the first terminal of the first transistor T1 described with reference to FIG. 14, and the source electrode TE2 may have the same configuration as the second terminal of the first transistor T1 described with reference to FIG. 14.

The protective layer PSV is positioned on the drain electrode TE1 and the source electrode TE2 of the first transistor T1 to cover the drain electrode TE1 and the source electrode TE2 of the first transistor T1, and the interlayer insulating layer ILD.

The protective layer PSV may include an inorganic insulating layer and/or an organic insulating layer. The inorganic insulating layer may include at least one of a metal oxide, such as silicon oxide ($SiO_x$), silicon nitride ($SiN_x$), silicon oxynitride ($SiO_xN_y$), and aluminum oxide ($AlO_x$). The organic insulating layer may include at least one of acrylic resin (polyacrylates resin), epoxy resin, phenolic resin, polyamides resin, polyimides rein, unsaturated polyester resin, polyphenylene ethers resin, polyphenylene sulfides resin, and benzocyclobutene resin.

The protective layer PSV may include a contact hole exposing the source electrode TE2 of the first transistor T1, and the source electrode TE2 of the first transistor T1 may be physically and/or electrically connected to the first pixel electrode ELT1 through the contact hole of the protective layer PSV.

The display element layer DPL may be positioned on the protective layer PSV.

The display element layer DPL may include a bank pattern BNP, a bank BNK, an alignment electrode ALE, a light emitting element LD, a pixel electrode ELT, and a plurality of insulating layers INS1 and INS2.

The bank pattern BNP is positioned on the protective layer PSV. The bank pattern BNP may have a cross-section of a trapezoidal shape in which a width becomes narrower from one surface (for example, an upper surface) of the protective layer PSV toward an upper portion along the third direction DR3. According to one or more embodiments, the bank pattern BNP may have a curved surface having a cross-section of a semi-elliptical shape, a semi-circular shape (or a semi-spherical shape), or the like in which a width becomes narrower from one surface (for example, the upper surface) of the protective layer PSV toward the upper portion along the third direction DR3. When viewed in a cross-section, a shape of the bank pattern BNP is not limited to the above-described embodiments, and may be variously changed within a range capable of improving efficiency of the light emitted from each of the light emitting elements LD.

The bank pattern BNP may be an inorganic insulating layer including an inorganic material or an organic insulating layer including an organic material. According to one or more embodiments, the bank pattern BNP may include an organic insulating layer of a single layer and/or an inorganic insulating layer of a single layer, but the disclosure is not limited thereto. According to one or more embodiments, the bank pattern BNP may be omitted.

The bank pattern BNP may include a first bank pattern BNP1, a second bank pattern BNP2, and a third bank pattern BNP3 positioned to be spaced apart from each other in the first direction DR1. At least one light emitting element LD may be located between two bank patterns among the first bank pattern BNP1, the second bank pattern BNP2, and the third bank pattern BNP3.

The alignment electrode ALE may be positioned on the bank pattern BNP. When viewed in a cross-section, each alignment electrode ALE may have a surface profile corresponding to a shape of the bank pattern BNP. According to one or more embodiments, when the bank pattern BNP is omitted, the alignment electrode ALE may be positioned on an upper surface of the protective layer PSV.

Each alignment electrode ALE may be formed of a material having a constant reflectance to allow the light emitted from the light emitting element LD may proceed in an image display direction (for example, the third direction DR3) of the display device. For example, each alignment electrode ALE may be configured as a single layer including a conductive oxide, such as indium tin oxide (ITO), indium zinc oxide (IZO), zinc oxide (ZnO), indium gallium zinc oxide (IGZO), and indium tin zinc oxide (ITZO), a conductive polymer, such as poly(3,4-ethylenedioxythiophene) (PEDOT), or the like. In addition, the alignment electrode ALE may be configured as multiple layers further including at least one of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, or an alloy thereof.

The alignment electrode ALE may include a first alignment electrode ALE1, a second alignment electrode ALE2, a third alignment electrode ALE3, and a fourth alignment electrode ALE4 positioned to be spaced apart from each other in the first direction DR1.

The first alignment electrode ALE1 may be positioned on the first bank pattern BNP1 and the protective layer PSV, the second alignment electrode ALE2 may be positioned on the second bank pattern BNP2 and the protective layer PSV, the third alignment electrode ALE3 may be positioned on the second bank pattern BNP2 and the protective layer PSV, and the fourth alignment electrode ALE4 may be positioned on the third bank pattern BNP3 and the protective layer PSV.

Each of the first alignment electrode ALE1 or the third alignment electrode ALE3 may be physically and/or electrically connected to the source electrode TE2 of the first transistor T1 through a contact hole of the protective layer PSV.

The first insulating layer INS1 is positioned on the alignment electrode ALE, the bank pattern BNP, and the protective layer PSV to cover the alignment electrode ALE, the bank pattern BNP, and the protective layer PSV. The first insulating layer INS1 may be positioned between two adjacent alignment electrodes among the first alignment electrode ALE1, the second alignment electrode ALE2, the third alignment electrode ALE3, and the fourth alignment electrode ALE4, to reduce or prevent the likelihood of the two alignment electrodes being shorted to each other.

The first insulating layer INS1 may include an inorganic insulating layer formed of an inorganic material or an organic insulating layer formed of an organic material. For example, the first insulating layer INS1 may include at least one of a metal oxide, such as silicon nitride ($SiN_x$), silicon oxide ($SiO_x$), silicon oxynitride ($SiO_xN_y$), and aluminum oxide ($AlO_x$), but the disclosure is not limited thereto. The first insulating layer INS1 may be formed of an inorganic insulating layer or an organic insulating layer advantageous for protecting the light emitting elements LD from the pixel circuit layer PCL.

The light emitting element LD is positioned on the first insulating layer INS1. The first end EP1 of one light emitting element LD may be positioned to face the first alignment electrode ALE1, and the second end EP2 of one light emitting element LD may be positioned to face the second alignment electrode ALE2. In addition, the first end EP1 of another light emitting element LD may be positioned to face the third alignment electrode ALE3, and the second end EP2 of the other light emitting element LD may be positioned to face the fourth alignment electrode ALE4. Accordingly, the light emitting element LD may receive a voltage of the first driving power VDD (refer to FIG. 14) through the first end EP1 and may receive a voltage of the second driving power VSS (refer to FIG. 14) through the second end EP2.

The bank BNK may be positioned on the first insulating layer INS1. The bank BNK may be positioned in the non-emission area NEA. The bank BNK may be a dam structure that reduces or prevents the likelihood of a solution including the light emitting elements LD flowing into the emission area EA of an adjacent pixel PXL or controls a certain amount of solution to be supplied to each emission area EA, in a step of supplying the light emitting elements LD to the emission area EA.

The bank BNK may be configured to include a light blocking material and/or a reflective material to reduce or prevent a light leakage defect in which light (or rays) is leaked between each pixel PXL and pixels PXL adjacent thereto. According to one or more embodiments, the bank BNK may include a transparent material. For example, the bank BNK may include a polyamides resin, a polyimides resin, and the like, but the disclosure is not limited thereto. According to one or more other embodiments, a reflective material layer may be separately provided and/or formed on the bank BNK to further improve efficiency of light emitted from the pixel PXL.

The bank BNK is positioned on the first insulating layer INS1, but the disclosure is not limited thereto. According to one or more embodiments, the bank BNK may be positioned on the upper surface of the protective layer PSV, and may be positioned to at least partially overlap the alignment electrode ALE.

The second insulating layer INS2 may be positioned on the light emitting element LD. The second insulating layer INS2 may be positioned on a portion of an upper surface of the light emitting element LD so that the first end EP1 and the second end EP2 of the light emitting element LD are exposed to the outside. After alignment of the light emitting elements LD in the pixel PXL is completed, the second insulating layer INS2 may be positioned on the light emitting elements LD to reduce or prevent the likelihood of the light emitting elements LD being separated from an aligned position.

In addition, the second insulating layer INS2 may be positioned to overlap a portion of the first insulating layer INS1. The second insulating layer INS2 may be positioned over the emission area EA and the non-emission area NEA.

The second insulating layer INS2 may be configured as a single layer or multiple layers, and may include an inorganic insulating layer including at least one inorganic material or an organic insulating layer including at least one organic material. For example, the second insulating layer INS2 may include at least one of a metal oxide, such as silicon nitride ($SiN_x$), silicon oxide ($SiO_x$), silicon oxynitride ($SiO_xN_y$), and aluminum oxide ($AlO_x$), but the disclosure is not limited thereto.

When a gap (or a space) exists between the first insulating layer INS1 and the light emitting element LD before formation of the second insulating layer INS2, the gap may be filled with the second insulating layer INS2 in a process of forming the second insulating layer INS2. In this case, the second insulating layer INS2 may be formed of an insulating layer suitable for filling the gap between the first insulating layer INS1 and the light emitting element LD. For example, the second insulating layer INS2 may be formed of an organic insulating layer including an organic material according to a design condition of the display device including the light emitting elements LD.

The pixel electrode ELT is positioned to overlap at least a portion of the alignment electrode ALE, the first insulating layer INS1, the light emitting element LD, and the second insulating layer INS2.

The pixel electrode ELT may include a transparent conductive material, such as indium tin oxide (ITO), indium zinc oxide (IZO), zinc oxide (ZnO), and indium gallium zinc oxide (IGZO).

The pixel electrode ELT may include a first pixel electrode ELT1, a second pixel electrode ELT2, a third pixel electrode ELT3, a fourth pixel electrode ELT4, and a fifth pixel electrode ELT5.

The first pixel electrode ELT1 may directly contact the first end EP1 of the light emitting element LD, and may be physically and/or electrically connected to the first end EP1 of the light emitting element LD. The first pixel electrode ELT1 may be in direct contact with the first alignment electrode ALE1 exposed by the first insulating layer INS1 to be physically and/or electrically connected to the first alignment electrode ALE1.

The second pixel electrode ELT2 may directly contact the second end EP2 of the light emitting element LD and may be physically and/or electrically connected to the second end EP2 of the light emitting element LD. The second pixel electrode ELT2 may be in direct contact with the second alignment electrode ALE2 exposed by the first insulating layer INS1 to be physically and/or electrically connected to the second alignment electrode ALE2.

The third pixel electrode ELT3 may directly contact the first end EP1 of the light emitting element LD, and may be physically and/or electrically connected to the first end EP1 of the light emitting element LD. The third pixel electrode ELT3 may be in direct contact with the third alignment electrode ALE3 exposed by the first insulating layer INS1 to be physically and/or electrically connected to the third alignment electrode ALE3.

The fourth pixel electrode ELT4 may directly contact the second end EP2 of the light emitting element LD, and may be physically and/or electrically connected to the second end EP2 of the light emitting element LD. The fourth pixel electrode ELT4 may be in direct contact with the fourth alignment electrode ALE4 exposed by the first insulating layer INS1 to be physically and/or electrically connected to the fourth alignment electrode ALE4.

The fifth pixel electrode ELT5 may be positioned on the second insulating layer INS2, and may be positioned to be spaced apart from the first pixel electrode ELT1 and the fourth pixel electrode ELT4. The fifth pixel electrode ELT5 may be located on the bank pattern BNP and the bank BNK across the emission area EA and the non-emission area NEA.

Although the disclosure has been described with reference to the embodiments above, those skilled in the art or those having a common knowledge in the art will understand that the disclosure may be variously modified and changed without departing from the spirit and technical area of the disclosure described in the claims which will be described later.

Therefore, the technical scope of the disclosure should not be limited to the contents described in the detailed description of the specification, but should be defined by the claims, with functional equivalents thereof to be included therein.

What is claimed is:

1. A display device comprising: a flexible display panel; a connection film at least partially overlapping the display panel, and electrically connected to the display panel; source boards at least partially overlapping the connection film, and electrically connected to the connection film; and a flexible printed circuit portion electrically connecting the source boards, and wound or folded on the source boards, wherein the flexible printed circuit portion comprises a first connection portion partially protruding in a first direction, a second connection portion partially protruding in a direction that is substantially opposite to the first connection portion, and a body extending in a second direction that is substantially perpendicular to the first direction, and wherein the body is on the source boards, and is wound by being rotated.

2. The display device according to claim 1, wherein the source boards comprise a connector portion, wherein the first connection portion is electrically connected to the connector portion of one of the source boards, and wherein the second connection portion is electrically connected to the connector portion of another of the source boards.

3. The display device according to claim 1, further comprising: a control board spaced apart from a source board of the source boards, and electrically connected to the source board; and a cable between the source board and the control board to electrically connect the source board and the control board.

4. The display device according to claim 1, further comprising: a housing for accommodating the display panel; and a cylinder inside the housing and winding, and configured to deploy the display panel.

5. A display device comprising: a flexible display panel; a connection film at least partially overlapping the display panel, and electrically connected to the display panel; source boards at least partially overlapping the connection film, and electrically connected to the connection film; and a flexible printed circuit portion electrically connecting the source boards, and wound or folded on the source boards, wherein the flexible printed circuit portion comprises a first connection portion partially protruding in a first direction, a second connection portion partially protruding in a direction that is substantially opposite to the first connection portion, a body extending in a second direction that is substantially perpendicular to the first direction, and a folding line extending in the second direction.

6. The display device according to claim 5, wherein the body is on the source boards, and is folded in the first direction.

7. A display device comprising: a flexible display panel; a connection film at least partially overlapping the display panel, and electrically connected to the display panel; source boards at least partially overlapping the connection film, and electrically connected to the connection film; and a flexible printed circuit portion electrically connecting the source boards, and wound or folded on the source boards, wherein the flexible printed circuit portion comprises a first connection portion partially protruding in a first direction, a second connection portion partially protruding in a direction that is substantially opposite to the first connection portion, and a body extending in a second direction that is substantially perpendicular to the first direction, and wherein the flexible printed circuit portion defines a groove extending in the second direction.

8. The display device according to claim 7, wherein the body is on the source boards, and is folded in the first direction.

9. A display device comprising: a flexible display panel; a connection film at least partially overlapping the display panel, and electrically connected to the display panel; source boards at least partially overlapping the connection film, and electrically connected to the connection film; a flexible printed circuit portion electrically connecting the source boards, and wound or folded on the source boards; and a cylinder for winding and deploying the display panel, wherein the connection film, the source boards, and the flexible printed circuit portion are accommodated in the cylinder.

10. The display device according to claim 9, wherein the flexible printed circuit portion comprises a first connection portion partially protruding in a first direction, a second connection portion partially protruding in a direction that is substantially opposite to the first connection portion, and a body extending in a second direction that is substantially perpendicular to the first direction.

11. The display device according to claim 10, wherein the source boards comprise a connector portion, wherein the first connection portion is electrically connected to the connector portion of one of the source boards, and wherein the second connection portion is electrically connected to the connector portion of another of the source boards.

12. The display device according to claim 10, wherein the body is on the source boards, and is wound by being rotated.

13. The display device according to claim 10, wherein the flexible printed circuit portion further comprises a folding line extending in the second direction.

14. The display device according to claim 13, wherein the body is on the source boards, and is folded in the first direction.

15. The display device according to claim 10, wherein the flexible printed circuit portion defines a groove extending in the second direction.

16. The display device according to claim 15, wherein the body is on the source boards, and is folded in the first direction.

17. The display device according to claim 9, further comprising: a control board spaced apart from a source board of the source boards, and electrically connected to the source board; and a cable between the source board and the control board to electrically connect the source board and the control board.

18. The display device according to claim 9, wherein the flexible printed circuit portion comprises a flexible printed circuit film.

* * * * *